United States Patent [19]

Humphrey et al.

[11] Patent Number: 4,672,609
[45] Date of Patent: Jun. 9, 1987

[54] MEMORY SYSTEM WITH OPERATION ERROR DETECTION

[75] Inventors: Richard A. Humphrey, Sunnyvale; Steven D. Fisher, San Mateo; Steven W. Wierenga, Sunnyvale; Jon Sjostedt, San Francisco, all of Calif.

[73] Assignee: Tandem Computers Incorporated, Cupertino, Calif.

[21] Appl. No.: 846,463

[22] Filed: Mar. 28, 1986

Related U.S. Application Data

[63] Continuation of Ser. No. 738,565, May 28, 1985, abandoned, which is a continuation of Ser. No. 340,611, Jan. 19, 1982, abandoned.

[51] Int. Cl.$^4$ .................. G11C 29/00; G06F 11/30
[52] U.S. Cl. ........................................ 371/21; 364/900
[58] Field of Search ............... 371/21, 51, 60, 68; 364/200 MS File, 900 MS File

[56] References Cited

U.S. PATENT DOCUMENTS

| | | | |
|---|---|---|---|
| 3,231,858 | 1/1966 | Tuomenoksa et al. | 371/38 |
| 3,982,111 | 9/1976 | Lerner et al. | 371/51 X |
| 4,101,969 | 7/1978 | Lawson et al. | 364/900 |
| 4,161,778 | 7/1979 | Getson, Jr. et al. | 364/200 |
| 4,228,496 | 10/1980 | Katzman et al. | 364/200 |
| 4,326,290 | 4/1982 | Davis et al. | 371/21 |
| 4,365,295 | 12/1982 | Katzman et al. | 364/200 |

OTHER PUBLICATIONS

Search Report from European Patent Application Publication No. 84,460, Based on Application No. 83300250, Search Report Published Jun. 11, 1986.

H. F. Heath, Jr. and S. S. Husson, IBM Technical Disclosure Bulletin, *Storage Address Checking*; vol. 12, No. 12, May 1980, pp. 2217-2219.

C. V. Freiman et al, IBM Technical Disclosure Bulletin, *Detecting Storage Address Failures With Data Parity*, vol. 12, No. 5, Oct. 1969, 652.

*Primary Examiner*—Jerry Smith
*Assistant Examiner*—Clark A. Jablon
*Attorney, Agent, or Firm*—Townsend and Townsend

[57] ABSTRACT

A memory system for a computer detects data errors, address errors and operation errors to increase the reliability of data stored in the memory system. Address errors are detected by encoding address parity information into the data check field of each memory location. A signal is generated in each memory module indicating the status of operations of that memory module and is transmitted to the processor subsystem of the computer for comparison with a signal indicating the status of operations of the processor subsystem to insure that all memory modules and the memory control in the processor are receiving the same commands.

8 Claims, 13 Drawing Figures

FIG. 1

FIG. 2 SEMICONDUTOR MEMORY MODULE

FIG. 3

FIG. 4-A
REFRESH

FIG. 4-B
WRITE

FIG. 4-C
READ

FIG. 4-D
RESET

FIG. 4-E

ID [(READ·REFRESH·WRITE)+
(READ·REFRESH)+(READ·WRITE)+
(WRITE·REFRESH)]

FIG. 4-F $\overline{\text{ID}}$ [(READ·REFRESH·WRITE)+
(READ·REFRESH)+(READ·WRITE)+
(WRITE·REFRESH)]

FIG. 5 ADDRESS PARITY BIT GENERATION & CHECK BIT GENERATION

FIG. 6 CHECK BIT COMPARATOR

MEMORY SYSTEM WITH OPERATION ERROR DETECTION

CROSS REFERENCE TO RELATED APPLICATIONS

This application is a continuation of application Ser. No. 738,565, filed May 28, 1985, now abandoned, which was a continuation of Ser. No. 340,611, filed Jan. 19, 1982 and now abandoned.

This application relates to a memory system of the general kind shown in U.S. application Ser. No. 721,043 filed Sept. 7, 1976 (and now issued as U.S. Pat. No. 4,228,496) and U.S. application Ser. No. 06/147,309 filed May 6, 1980, and now U.S. Pat. No. 4,365,295 which is a division of parent application Ser. No. 721,043 filed Sept. 7, 1976 and now U.S. Pat. No. 4,228,496.

BACKGROUND OF THE INVENTION

This invention relates to a memory system for a computer. It relates particularly to a word organized, random access, read-write or read-only memory of the kind having a semiconductor array with a data field and a data check field for detecting data errors in each word. The invention is applicable also to memory arrays other than semiconductor arrays, for example, core memory and other types of bit storage means. The memory word may represent more than one data word in a particular computer.

The present invention is applicable to a memory system of the kind in which a processor module is associated with one or more memory modules.

The memory system of the present invention permits data errors, addressing errors and operation errors to be detected.

Errors in stored data can be caused by the sticking of one or more bits in a data word stored in a semiconductor memory, and such errors can be detected by associating a data check field with the data field of the stored word. Various types of errors can be detected by codes associated with the data check fields. For example, with a Hamming code like that disclosed in U.S. Pat. No. 4,228,496 issued Oct. 14, 1980, (and assigned to the same assignee as the assignee of the present application) all single bit data errors can be detected and corrected, all double bit data errors can be detected and some errors involving more than two data bits can be detected.

To increase the overall reliability of a memory system, it-is desirable to detect addressing errors as well as errors in the stored data.

It is known to build a self-checking memory address decoder in the straightforward way (by duplicating and comparing outputs; but this can become prohibitive in size and cost as the size of the address increases. Thus, in a 20 bit address there are two to the twentieth power decoder outputs, requiring roughly two to the eighteenth power (about 262,000) integrated circuits just to compare. In addition, in a real main memory the address decoding is carried out at several levels: first a "module compare" to select one of several PC boards, then a "row decode" to select one word of memory devices, then internal X-Y decoders to select an individual bit cell in the memory devices. This creates further problems in obtaining a self-checking operation of memory address.

Obtaining satisfactory address error detection with a reasonable integrated circuit package count has been a problem in the prior art.

Data error detection and/or correction itself does not protect against an operation error in a memory system. For example, if contention on a bus should result in producing a write command at the wrong time, the error system for detecting stuck bits in a data field would not give any protection against the memory error resulting from the erroneous operation command.

To provide high reliability in a memory system, it is desirable to insure that the operations of each memory module are in step with the operations of the associated processor module.

It is a primary object of the present invention to detect address errors by coding address parity information into the data check field of each memory location.

It is a related object to detect address errors by an encoding technique that does not require storing the address for address error detection.

It is another related object to increase the system-level reliability by a substantial amount, as much as 10 to 100 times, by including the address parity bit method in an already existing data check code generation system so that address error detection can be obtained at essentially no cost.

It is a further object of the present invention to insure that all memory modules and the memory control in the processor are receiving the same commands.

It is a related object to detect any difference in the operations sequence between the processor and all memory modules and to provide an interrupt to the processor if there is a difference.

It is a related object to generate a signal in each memory module indicating the status of operation of that memory module and to transmit that signal to operation check logic in the processor for comparison to the status of operations of the processor module.

It is a still further object of the present invention to combine data error, address error and operation error detection in a memory system to increase the system level reliability.

SUMMARY OF THE INVENTION

In the present invention a processor module is associated with one or more memory modules in a way that permits data errors, addressing errors, and operation errors to be detected.

The memory system of the present invention includes a processor subsystem and a memory subsystem.

The processor subsystem comprises a map/memory control, error correction code logic, operation check logic and a memory system error encoder. All of these components are physically located in the processor subsystem portion of the memory system. This configuration assures that address faults arising in cabling and connectors are detected that might otherwise go undetected if the error correction code structure were located in the memory modules.

Each memory module comprises a semiconductor storage array, timing and control logic, and buses for connecting the storage array to the map/memory control and error correction code logic and for connecting the timing and control logic to the map/memory control.

Each memory module also has an operation state bus connectable to the operation check logic of the processor module and an operation state machine associated with the operation state bus and the timing and control logic for generating a signal indicating the status of operations of the memory module and for transmitting that signal to the operation check logic for comparison to the status of operations of the processor module.

In a specific embodiment of the present invention, the semiconductor storage array has sixteen data bit positions and six check bit positions forming a twenty-two bit storage word.

The error correction code is a Hamming code effective to detect and correct all single data bit errors, and to detect all double data bit errors and to detect some data bit errors that involve more than two bits.

In the present invention the address parity information is coded into the six bit check field in a way that permits the error correction code logic to detect all single bit address errors and to detect some multiple bit address errors, even in the presence of a single bit data error.

In a particular embodiment of the present invention, the encoding for address error detection is done in stages. In a first stage a 23 bit address is encoded in a 13 bit parity tree and a 10 bit parity tree to produce two parity bits on separate lines. These two parity bits are then encoded according to a connection pattern of a nine bit parity tree into the six check bit field. Thus, the 23 bit address is encoded as part of the six check bits in the 22 bit data code word supplied to the semiconductor storage array.

On a subsequent read operation, a data code word is read from the memory array and is combined with newly generated read address parity bits transmitted to a check bit comparator. In the check bit comparator these two address parity bits are combined with the data code word read to generate a syndrome on a syndrome bus that indicates the type of error, if any.

Since, as noted above, the error correction code itself will not protect against errors resulting from improper operation, such as, for example, an improper write command, the present invention incorporates an operation state mechanism in each memory module for generating a signal indicating the status of operations in that memory module. This generated signal is then compared with a signal representing the status of operations in the processor module, and the operation check logic detects any difference in the status of operations and provides an error signal resulting in an interrupt if there is any logical difference between the two signals.

Memory system apparatus and methods that incorporate the structure and techniques described above and that are effective to function as described above constitute further, specific objects of this invention.

Other and further objects of the present invention will be apparent from the following description and claims and are illustrated in the accompanying drawings which, by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWINGS

FIG. 5 is a diagram of the address parity bits generator and check bits generator used in the error correction code logic 15 of the memory system shown in FIG. 1. FIG. 5 also lists logic equations for two of the 9-bit parity trees used in the check bit generator.

DETAILED DESCRIPTION OF THE PREFERRED EMBODIMENT

Figure 1:
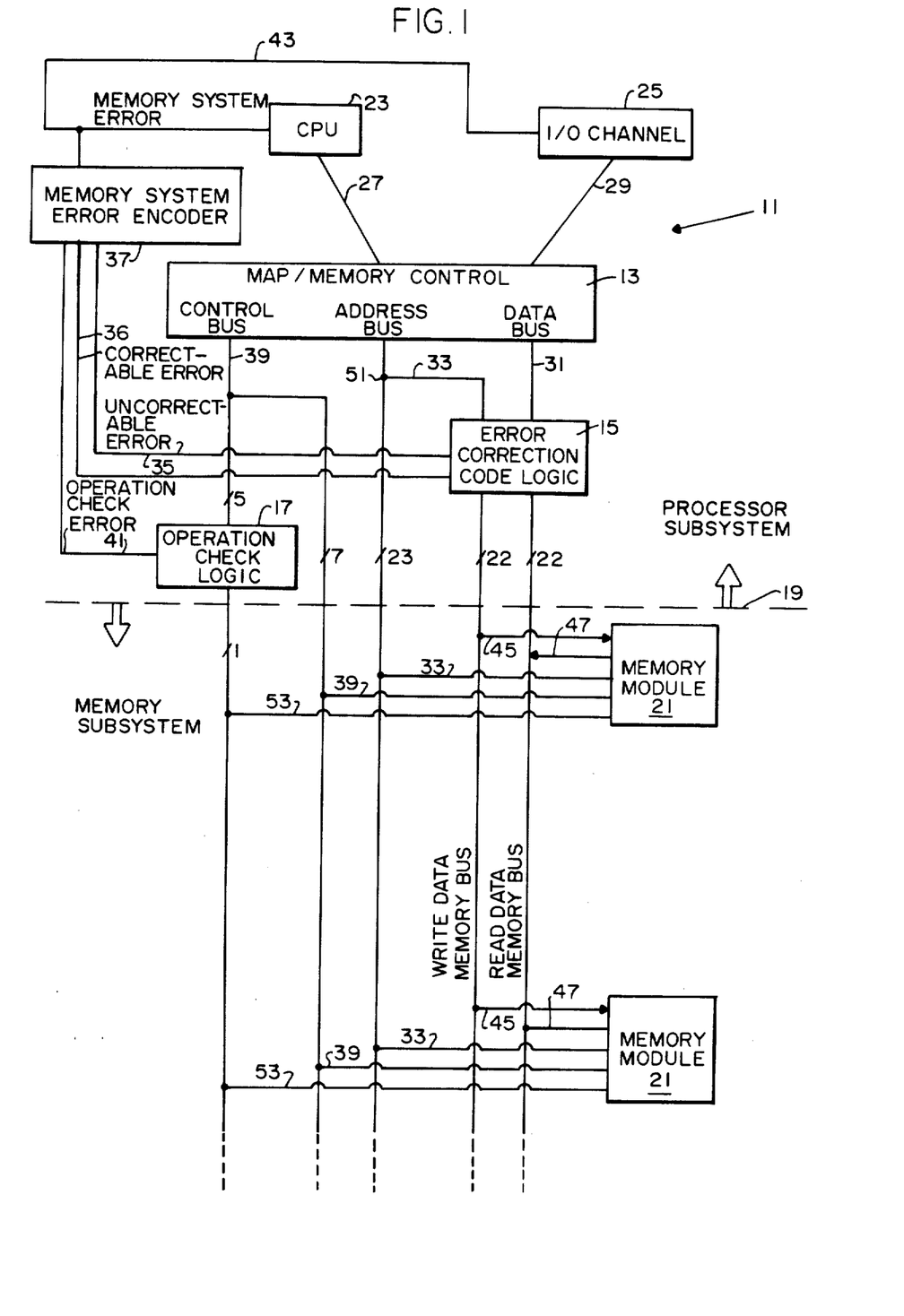
FIG. 1 is a block diagram of a memory system constructed in accordance with one embodiment of the present invention.

A memory system constructed in accordance with one embodiment of the present invention is indicated generally in FIG. 1 by the reference numeral 11.

The memory system 11 is incorporated in a multiple processor system of the kind shown in U.S. Pat. No. 4,228,496 issued Oct. 14, 1980, and assigned to the same assignee as the assignee of this application. This U.S. Pat. No. 4,228,496 is hereby incorporated by reference (and is hereinafter referred to as the "referenced patent") in this specification in accordance with Section 608.01(P) of the *Manual of Patent Examining Procedure.*

The memory control system of the present invention has specific use in a multiple processor system of the kind shown in the referenced patent but is not restricted to use in such systems. The memory system of the present invention also has utility in a single processor system.

The memory system of the present invention will now be described with reference to FIG. 1 and FIGS. 2-8 of the drawings of this application. FIG. 1 of this application corresponds generally with FIG. 34 of the referenced patent.

The memory system as shown in FIG. 1 comprises a map/memory control 13, an error correction code logic 15, an operation check logic 17, and a memory system error encoder 37, all of which are physically located in the processor subsystem portion of the memory system (as indicated diagramatically by the arrow pointing upwardly from the dashed line 19) and one or more memory modules 21 which are physically located in the memory subsystem (as indicated diagramatically by the arrow pointing downwardly from the dashed line 19).

The map/memory control 13 is associated with a central processor unit 23 by a bus 27 which comprises data, logical address, and control lines, and an input/output channel 25 of the processor subsystem as illustrated in FIG. 1. The I/O channel 25 is connected to the map/memory control 13 by a bus 29 which also comprises data, logical address and control lines.

In the particular embodiment illustrated in FIG. 1, the central processor unit 23 corresponds in general to the CPU 105 shown in FIG. 34 of the referenced patent, and the I/O channel 25 of FIG. 1 corresponds generally to the I/O channel 109 of the referenced patent.

The error correction code logic 15 is associated with the map/memory control 13 by a data bus 31 and an address bus 33. The error correction code logic 15 has output lines 35 and 36 connected to a memory system error encoder 37. The output line 35 signifies "uncorrectable error", while the output line 36 signifies "correctable error".

The operation check logic 17 is connected to the map/memory control 13 by a control bus 39. The operation check logic 17 is also connected to the memory system error encoder 37 by an operation check error line 41.

The memory system error encoder 37 has a memory system error output bus 43 which is, in turn, connected to the CPU 23 and input/output channel 25 as illustrated in FIG. 1.

Each memory module 21 has five bus connections which associate the memory module 21 with the map/memory control 13, the error correction code logic 15 and the operation check logic 17. Thus, each memory module 21 is connected to the error correction code logic 15 by a bidirectional data bus comprising two unidirectional data buses, an input (write) data bus 45 and an output (read) data bus 47.

Each memory module 21 is connected to the map/memory control 13 by an address bus 33.

Each memory module 21 has an operations state line 53 connected to the operation check logic 17.

Each memory module 21 is also connected to the map/memory control 13 by the control bus 39. The control bus 39 comprises seven lines. Only five of the lines go to the operation check logic 17; however, all seven lines of the control bus 39 are connected to each memory module 21. The number of bits on the control bus 39 and on other buses shown in the various figures of the drawings are indicated by the small numerals associated with slash marks on the bus lines.

The memory system shown in FIG. 1 includes four important functions that work in conjunction with and in addition to the basic operations of storing and retrieving data with word-addressable access, correction of single data errors, and detection of double data errors as described in the referenced patent. These functions will be described in more detail later in this specification.

The first function is address error detection which is performed by the error correction code logic 15 in combination with the memory module 21. Address error detection ensures that any faults in address transmission, comparison, and decoding logic which occur between the time of writing and reading a memory location are detected. The structure for performing this function is physically located in the processor subsystem. This configuration assures that address faults additionally arising in cabling and connectors are detected that might otherwise go undetected if that structure were located in the memory modules.

The second function is the generation of a signal in the memory module 21 to be used for operation error detection. This function is provided by operation state machine logic located in the memory module 21.

The third function is memory operation error detection which is performed by the operations check logic 17 in combination with the memory module 21.

The fourth function is the combination of the address error detection and the memory operation error detection.

Figure 2:
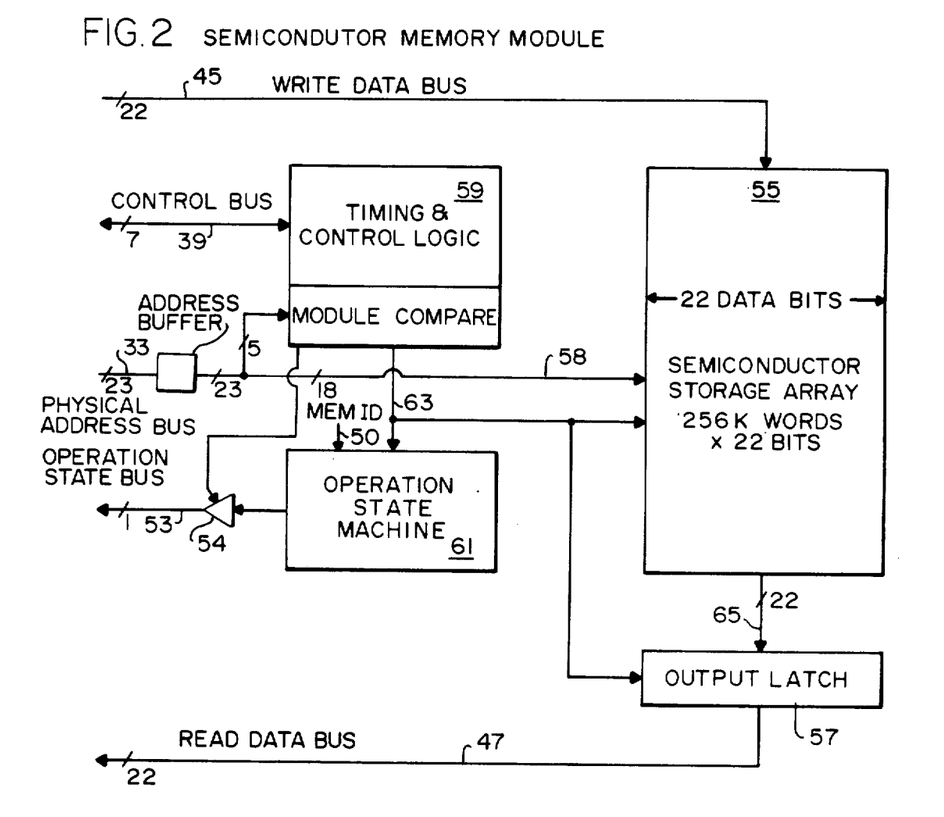
FIG. 2 shows further details of the memory module portion of the memory system shown in FIG. 1.

FIG. 2 shows more detail of the memory module 21 which comprises a semiconductor storage array 55 and an output latch 57.

The memory module 21 also includes timing and control logic 59 and operation state machine 61.

The timing and control logic 59 is connected to the operation state machine 61, the semiconductor storage array 55 and the output latch 57 by a bus 63 which comprises control signal lines.

The semiconductor storage array 55 is associated with the output latch 57 by a bus 65 which comprises data lines.

Referring again to FIG. 2, the first function of a memory module 21 is a storage function; the semiconductor storage array 55 in combination with the output latch 57 and the timing and control logic 59 provide a storage function for storing and retrieving data. The three basic operations of the storage function of the memory module are read, write, and refresh.

The second function of the memory module 21, that the operation check, employs the operation state machine 61. If (1) a missed operation, (2) a null operation—no READ, no WRITE, no REFRESH, and START, (3) a multiple . operation, for example, READ and WRITE and START, or (4) an incorrect operation, for example, READ instead of WRITE, and START occurs, then the operation state machine 61 changes state in a sequence different from that of the operation state machine 67 in the operation check logic 17 of FIG. 3.

This second function provides signals representing the state of the operation state machine 61 in each memory module 21 to the operation check logic 17 for checking the operation of the memory module 21. The operation state machine 61, based on signals representing the current state of timing and control logic 59 generates a signal indicating the status of memory module timing and control signals (read, write and refresh signals in their sequence) which is transmitted on the operation state line 53 to the operation check logic 17 (see FIG. 1). The signal transmitted on line 53 allows the operation check logic 17 to perform the operation check as described later in this application.

Figure 3:
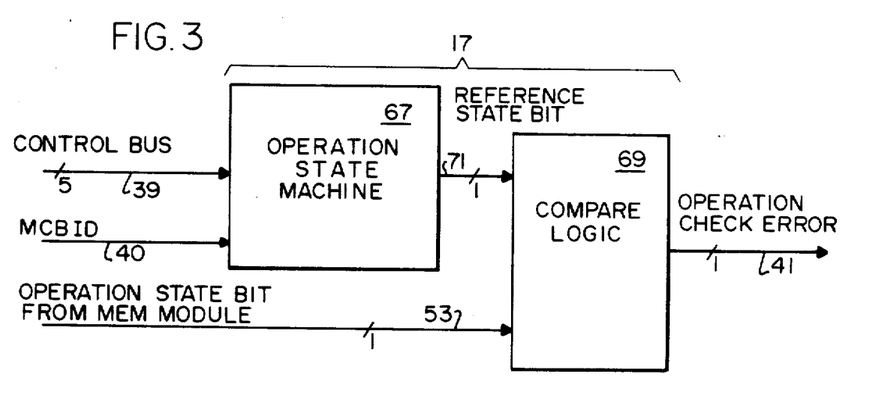
FIG. 3 is a view of the operation state machine and compare logic of the operation check logic portion of the memory system shown in FIG. 1.
Figure 4:
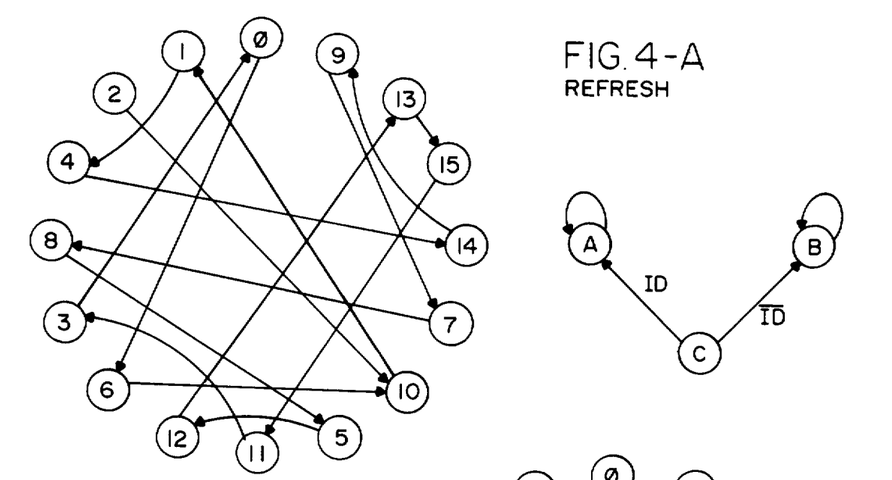
FIGS. 4A-4F are state machine diagrams for the state machines which are incorporated in the operation check logic of the memory subsystem and in the map/memory control of the processor subsystem of FIG. 1.

As shown in FIG. 3, the operation check logic 17 comprises an operation state machine 67 and a compare logic 69. The operation state machine 67 is connected to the compare logic 69 by a line 71 for transmitting a reference state bit to the compare logic 69.

Figure 7:
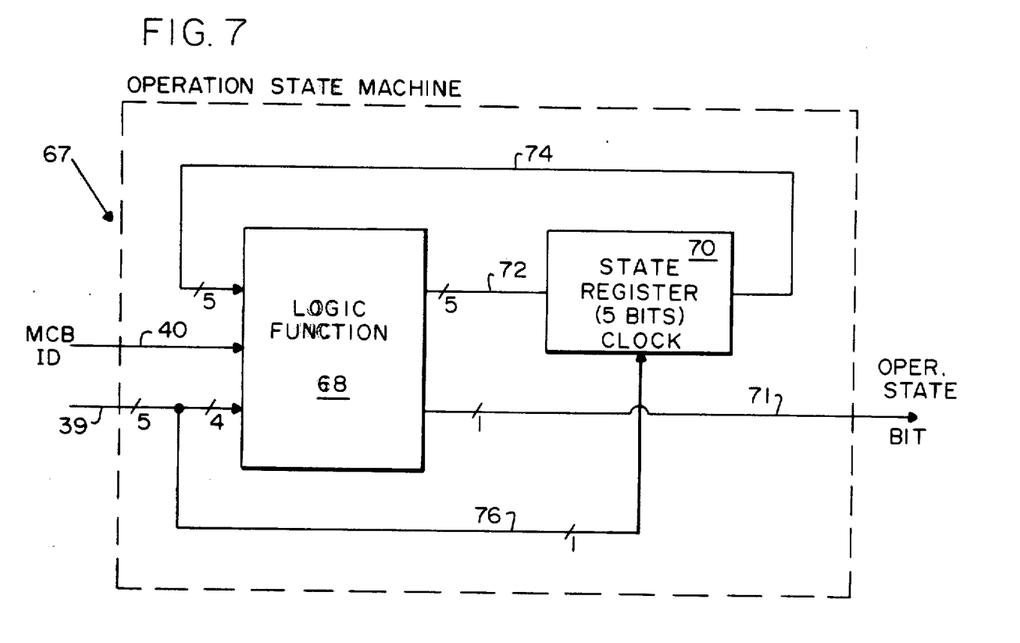
FIG. 7 shows details of the operation state machine 67 of FIG. 3.

As shown in FIG. 7, the operation state machine 67 comprises a logic function 68 and a state register 70. The control bus 39 supplies inputs to the logic function 68. A bus 72 connects the logic function to the state register 70, and a bus 74 feeds back signals from the state register 70 to the input of the logic function 68. A line 76 from the control bus 39 supplies a clock signal to the state register 70.

The logic function 68 implements the next state function of the state diagram in FIGS. 4A–4F.

In a specific implementation, the state register comprises five flip flops for storing the current state while the logic function 68 is computing the next state.

As shown in the state diagrams in FIGS. 4A–4F, the next state in any cycle depends upon the current state and the type of the current cycle. Four of the five signals on the bus 39 determine the type of cycle and the remaining signal is the clock.

The operation state machines 67 and 61 are identical. However, the operation state machine 61 is distinguished from the operation state machine 67 by the signal present on input 50 and 40, respectively. With certain cycles (null, multiple type), it is a known error condition and the state machine changes state indirectly through a state "C" (see FIGS. 4E and 4F) to a "lock" state which is maintained until reset. There are actually two "lock" states, A and B. If the state machine is in the operation check logic 17 (MCB ID=1 on line 40), the state machine makes a transition to the A state, and if it is in a memory module 21 (MEM ID=0 on line 50), it goes to the B state. If operation state machine 67 and operation state machine 61 are both in their respective locked states, then the reference state bit and operation state bit from the memory module disagree, causing an operation check error.

The compare logic 69 (see FIG. 3) checks the operation state bit from the memory module on the line 53 against the reference state bit from the operation state machine 67 on the line 71. The compare logic 69 generates a signal on the line 41 which indicates whether or not the two input signals on the lines 53 and 71 are logically equal. If they are not logically equal, the output signal on the line 41 indicates that the operation state machine 67 does not agree with the operation state machine 61 in the memory module 21 (see FIG. 2) and an operation error is identified. Note that any operation error is uncorrectable; thus, an operation check error will cause the memory system error lines 43 to signal that an uncorrectable memory error has occured, via the memory system error encoder 37.

In error-free operation, the signals on the lines 53 and 71 will not be logically different. However, if they are logically different an operation check error is identified, and an error signal is produced by the memory system error encoder 37. As will be described in more detail below, the operation check for a particular memory module is performed only during a read cycle of that memory module.

The combined operation of the operation state machine 61 and the operation check logic 17 protects against a number of factors including driver failures, receiver failures and cable failures which cause incorrect memory module operations. It also protects against memory module failures which preclude any module operation.

FIGS. 4A-4F are diagrams showing the states through which the operation state machine 67 of the processor subsystem and the operation state machine 61 of a memory module in the memory subsystem sequence in response to the input signals supplied to them. FIGS. 4A-4F are overlays of state transitions for one state machine. They are presented separately as illustrated in the specific FIGS. 4A, 4B, etc., for ease of understanding the transitions in particular cycles. Thus, for example, state 6 is the same for all cycles and for all of the FIGS. 4A-4F.

FIG. 4A shows the state transitions caused by a refresh cycle.

FIG. 4B shows the state transitions for a write cycle.

FIG. 4C shows the state transitions for a read cycle.

FIG. 4D shows the state transitions for a reset cycle.

FIG. 4E shows the state transitions for other cycles which are known error conditions, if the input signal 40 or 50 is a logical zero.

FIG. 4F shows the state transitions for other which are known error conditions, if the input signal 40 or 50 is a logical one.

Looking at FIG. 4D, after a reset cycle machines are in the state zero. Looking now at FIG. 4A, in response to a refresh cycle, the state machines would change state from state zero to state 6.

If continued refresh cycles are performed, then the continued state machine transitions would continue as indicated by the arrows in FIG. 4A. That is, the next transition would be from state 6 to state 10, the next transition would be from state 10 to state 1, etc. With continued reference to FIG. 4A if, after starting from state zero and changing state to state 6 (as described above) then the next cycle is a write cycle (as illustrated in FIG. 4B), then all the state machines will change state from state 6 to state 9.

FIGS. 4C-4F may be interpreted in a manner similar to that for FIGS. 4A and 4B.

Figure 5:
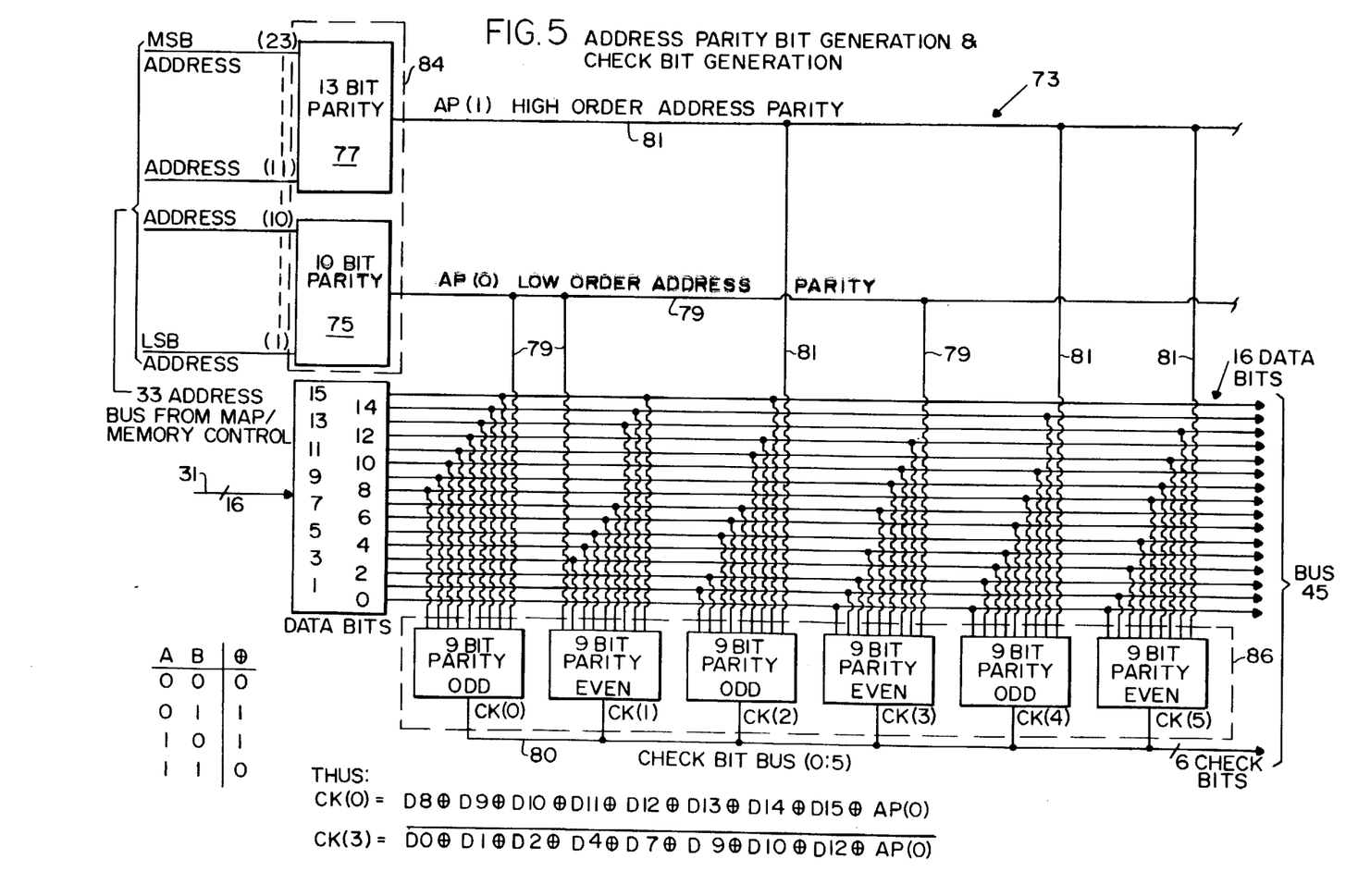
Figure 6:
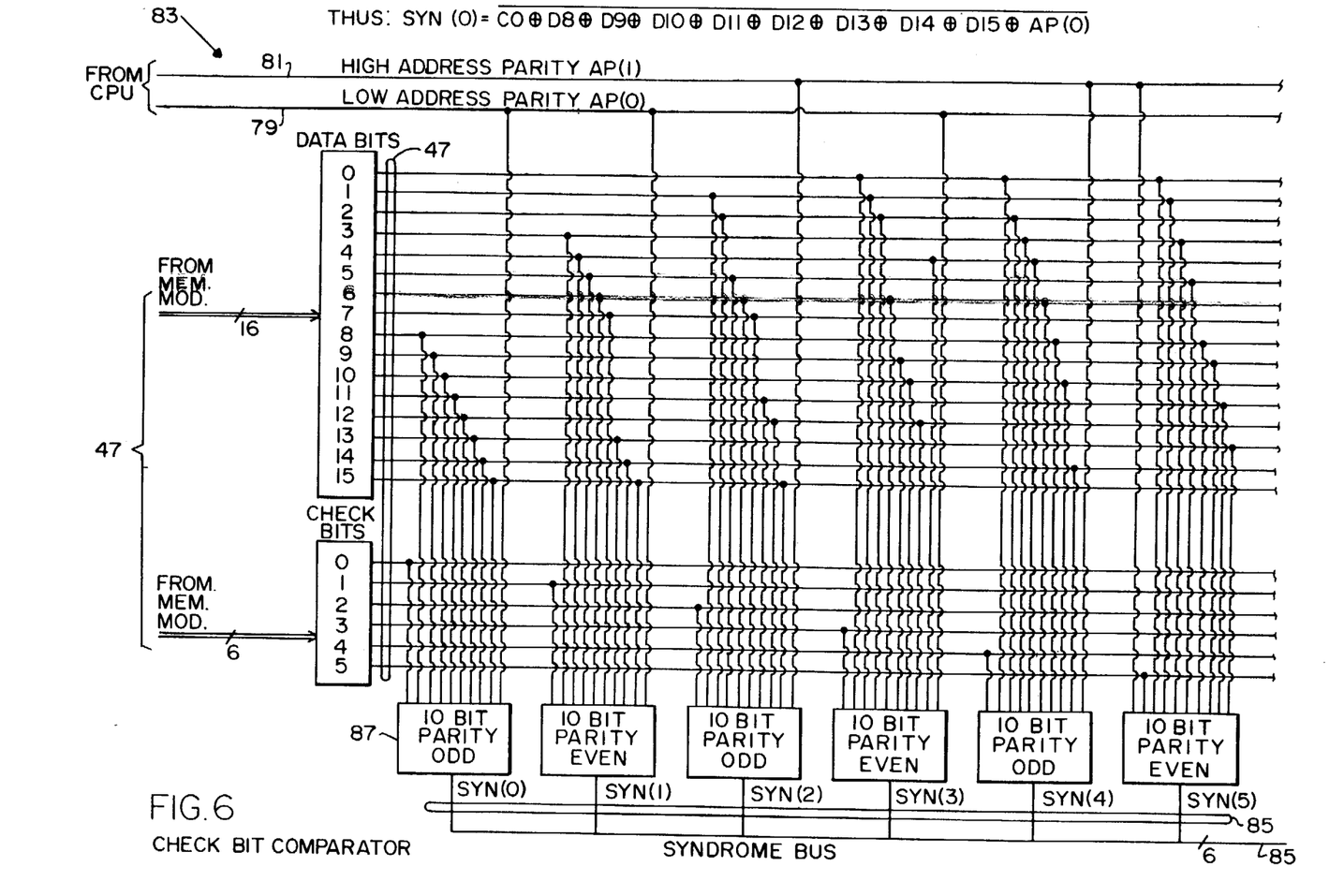
FIG. 6 shows the check bit comparator incorporated in the error correction code portion of the memory system shown in FIG. 1.

FIGS. 5 and 6 are detailed views of different parts of the error correction code logic 15 shown in FIG. 1.

FIG. 5 shows details of address parity bit generation and check bit generation in a generator unit 73.

The 16 data bits and the six check bits are transmitted from the error correction code logic 15 to the memory modules 21 on the bus 45 (see FIG. 1). It should be noted that, while 16 data bits and six check bits have been illustrated in the particular embodiment to be described, the system is applicable to either more or less of each according to the principles of single data error correcting and double error detecting Hamming codes.

The 9-bit parity trees of the check bit generator 86 shown in the lower part of FIG. 5 are basiqally similar in structure and mode of operation to the 8-bit parity trees of the check bit generator shown in FIG. 38 of the referenced patent, except that an additional input has been added to each parity tree and has been included in the logic equations. However, the truth table for the exclusive or operation shown in FIG. 5 applies to both an 8-bit and a 9-bit parity tree implementation.

The high and low order parity bits produced on lines 81 and 79 are based on the address. The address parity bit generator 84 shown in FIG. 5 comprises a 10-bit parity tree for address bits 1 through 10 and a 13-bit parity tree 77 for address bits 11 through 23. The parity tree 75 generates the low order address parity bit on line 79 which goes into check bit generators 0, 1,and 3. The 13-bit parity tree 77 generates the high order address parity bit on a line 81, and this line 81 supplies that bit to check bit generators 2, 4, and 5.

The generator 86 produces six check bits on 80, part of the bus 45, for storage in the memory array 55 of FIG. 2. These six check bits are used in connection with the 16 data bits to detect all single and double bit memory errors and to detect some three or more bit memory errors. The six check bits are also used in conjunction with the 16 data bits to correct single data bit errors. This mode of operation is the same as that described in connection with FIG. 38 of the referenced patent.

The two lines 79 and 81 comprise address parity information which is encoded into the six check bits on a write operation as described previously. During a subsequent read operation, lines 79 and 81 comprise address parity information based on the address for the current READ operation. These lines (79 and 81) are checked against the address parity information encoded in the six check bits read from the memory module and if the address parity information is found to differ, an uncorrectable memory error signal is asserted.

A typical addressing error that this invention would detect is a stuck address bit on address bus 58 (see FIG. 2), or a stuck address bit within the memory module itself. A word may be written to location $\phi$ with address parity formation for address $\phi$. If bus 58 had the least significant address bit stuck at $\phi$, then a READ operation to address 1 on bus 33 would transmit an address of $\phi$ on bus 58. The six check bits read contain a code for address parity of $\phi$. The error correction code (ECC) logic 15 indicates an addressing error.

FIG. 6 shows details of the check bit comparator 83 of the error correction code logic 15 shown in FIG. 1.

The check bit comparator 83 has three inputs, the lines 79 and 81 (see FIG. 5) and the read data bus 47. The check bit comparator 83 has an output 85 which is a syndrome bus.

In the check bit comparator 83, the 16 data bits of the read data bus 47 are connected to the parity trees as illustrated, and the six check bits of the read data bus 47 are similarly connected to the parity trees as illustrated.

The parity trees 87 function in the same way as the parity trees 505 shown in FIG. 39 of the reference patent except for the fact that the parity trees 87 are 10-bit parity trees while the parity trees 505 are 9-bit parity trees.

In accordance with the present invention, on a read cycle, lines 79 and 81 indicate the parity of the address which is being read. If this does not agree with the address parity encoded in the check bits, then a code is generated on the syndrome bus 85 to indicate an addressing error.

The check bit comparator 83 shown in FIG. 6 is used only during a read cycle. The address parity bit generator 84 in FIG. 5 is used during both read and write cycles. The check bit generator 86 shown in FIG. 5 is used only during a write cycle.

The error correction code logic 15 shown in FIG. 1 also includes a syndrome decoder which received the signal on the syndrome bus 85 (see the signals on the syndrome bus 85 in FIG. 6), and the syndrome decoder is the same as the syndrome decoder shown in FIG. 40 of the referenced patent.

The error correction code logic 15 also includes a bit complementer which is not shown in the drawings of this application but which performs the same function as the bit complementer shown in FIG. 41 of the referenced patent.

The syndrome code which is transmitted on the syndrome bus 85 is used, in the present invention, to identify address errors as well as data errors. Two of the multiple-error outputs obtained from the syndrome decoder 485 shown in FIG. 40 of the referenced patent are now used, in the present invention, to detect those errors.

The following Table 1 enumerates the 64 possible values of the six-bit syndrome code and gives the interpretation for each possible value as used in the present invention:

TABLE 1

SYNDROME CODES

| S0 | S1 | S2 | S3 | S4 | S5 | ERROR IN | S0 | S1 | S2 | S3 | S4 | S5 | ERROR IN |
|---|---|---|---|---|---|---|---|---|---|---|---|---|---|
| 0 | 0 | 0 | 0 | 0 | 0 | (No Error) | 1 | 0 | 0 | 0 | 0 | 0 | C0 |
| 0 | 0 | 0 | 0 | 0 | 1 | C5 | | 0 | | 0 | 0 | 1 | (Double) |
| | 0 | | 0 | 1 | 0 | C4 | | 0 | | 0 | 1 | 0 | (Double) |
| | 0 | | 0 | 1 | 1 | (Double) | | 0 | | 0 | 1 | 1 | D8 |
| | 0 | | 1 | 0 | 0 | C3 | | 0 | | 1 | 0 | 0 | (Double) |
| | 0 | | 1 | 0 | 1 | (Double) | | 0 | | 1 | 0 | 1 | D9 |
| | 0 | | 1 | 1 | 0 | (Double) | | 0 | | 1 | 1 | 0 | D10 |
| 0 | 0 | 0 | 1 | 1 | 1 | D0 | | 0 | | 1 | 1 | 1 | (Double) |
| 0 | 0 | 1 | 0 | 0 | 0 | C2 | 1 | 0 | 1 | 0 | 0 | 0 | (Double) |
| | 0 | | 0 | 0 | 1 | (Double) | | 0 | | 0 | 0 | 1 | D11 |
| | 0 | | 0 | 1 | 0 | (Double) | | 0 | | 0 | 1 | 0 | (Multi-All 0's) |
| | 0 | | 0 | 1 | 1 | (Address) | | 0 | | 0 | 1 | 1 | (Double) |
| | 0 | | 1 | 0 | 0 | (Double) | | 0 | | 1 | 0 | 0 | D12 |
| | 0 | | 1 | 0 | 1 | D1 | | 0 | | 1 | 0 | 1 | (Double) |
| | 0 | | 1 | 1 | 0 | D2 | | 0 | | 1 | 1 | 0 | (Double) |
| | 0 | | 1 | 1 | 1 | (Double) | | 0 | | 1 | 1 | 1 | (Multi) |
| 0 | 1 | 0 | 0 | 0 | 0 | C1 | 1 | 1 | 0 | 0 | 0 | 0 | (Double) |
| | 1 | | 0 | 0 | 1 | (Double) | | 1 | | 0 | 0 | 1 | D13 |
| | 1 | | 0 | 1 | 0 | (Double) | | 1 | | 0 | 1 | 0 | D14 |
| | 1 | | 0 | 1 | 1 | D3 | | 1 | | 0 | 1 | 1 | (Double) |
| | 1 | | 1 | 0 | 0 | (Double) | | 1 | | 1 | 0 | 0 | (Address) |
| | 1 | | 1 | 0 | 1 | (Multi-All 1's) | | 1 | | 1 | 0 | 1 | (Double) |
| | 1 | | 1 | 1 | 0 | D4 | | 1 | | 1 | 1 | 0 | (Double) |
| | 1 | | 1 | 1 | 1 | (Double) | | 1 | | 1 | 1 | 1 | (Multi) |
| 0 | 1 | 1 | 0 | 0 | 0 | (Double) | 1 | 1 | 1 | 0 | 0 | 0 | D15 |
| | 1 | | 0 | 0 | 1 | D5 | | 1 | | 0 | 0 | 1 | (Double) |
| | 1 | | 0 | 1 | 0 | D6 | | 1 | | 0 | 1 | 0 | (Double) |
| | 1 | | 0 | 1 | 1 | (Double) | | 1 | | 0 | 1 | 1 | (Multi) |
| | 1 | | 1 | 0 | 0 | D7 | | 1 | | 1 | 0 | 0 | (Double) |
| | 1 | | 1 | 0 | 1 | (Double) | | 1 | | 1 | 0 | 1 | (Multi) |
| | 1 | | 1 | 1 | 0 | (Double) | | 1 | | 1 | 1 | 0 | (Multi) |
| | 1 | | 1 | 1 | 1 | (Multi) | | 1 | | 1 | 1 | 1 | (Double) |

THUS (NUMBER OF 1'S IN SYNDROME)
0 BITS - NO ERROR
1 BIT - CHECK BIT ERROR
2 BITS - DOUBLE
3 BITS - DATA BIT OR MULTI OR ADDRESS
4 BITS - DOUBLE
5 BITS - MULTI
6 BITS - DOUBLE

A data error detection and correction system constructed according to the present invention detects and corrects all single bit data or check bit errors, detects all double bit data or check errors, and detects some data or check errors which involve more than two bits. The present invention also detects all single bit address errors, and detects some multiple bit address errors, even in the presence of single bit data or check errors. Address errors are not corrected. Operation errors, i.e., differences in states between the operation state machine in the memory modules 21 and the operation state machine in the operation check logic 17, are also detected.

The operation of the memory system 11 described above in the detection and correction of data errors is basically the same as that of the similar structure shown and described in the referenced patent. See column 72, line 53 through column 78, line 52. The detailed description of the parts of the present invention which correspond to those shown and described in that part of the referenced patent will therefore not be repeated in this specification. It should be noted that in the present invention the error correction code logic is located in the processor subsystem as shown in FIG. 1 as error correction code logic 15, rather than in the memory modules as described in the referenced patent.

In a particular embodiment of the present invention, the encoding is done in two stages. In a first stage, as illustrated in FIG. 5, a 23-bit address is encoded in 13-bit parity tree 77 and the 10-bit parity tree 75 to produce two parity bits on the lines 81 and 79 respectively. These two parity bits on the lines 81 and 79 are then encoded according to the connection pattern of the 9-bit parity trees in the six check bit bus 80, part of the bus 45 shown in FIG. 5.

Thus, the 23-bit address is encoded as part of the six check bits in the 22-bit data code word supplied on bus 45 to the semiconductor storage array 55 (see FIG. 2). On a subsequent read operation, a data code word is read from the memory array 55 (see FIG. 2) and is transmitted on the read data bus 47 (see FIGS. 2 and 6) where it is combined with the newly generated read address parity bits transmitted on the lines 79 and 81 to the check bit comparator 83 shown in FIG. 6. In the check bit comparator 83 these two address parity bits are combined with the data code word read to generate a syndrome on the syndrome bus 85 which indicates the type of error, if any.

An address error and a single data error in combination will always be detected as a double or multiple error. If an address error alone is detected, it will be reflected as one of two particular codes indicated on the syndrome bus (see Table 1 above). The detected address is signaled on line 35 (see FIG. 1) from error correction code logic 15 to the memory system error encoder 37, through which the signal passes onto the lines 43 to the CPU 23 and the I/O channel 25. The address error detected is treated as a memory system error by the CPU 23. CPU 23 then uses the information on syndrome bus 85 to determine the type of memory system error that was produced thereon; if the memory system error is an address error, then CPU 23 rejects the data. The CPU 23 then produces an interrupt of the current program and informs the operator.

Figure 8:
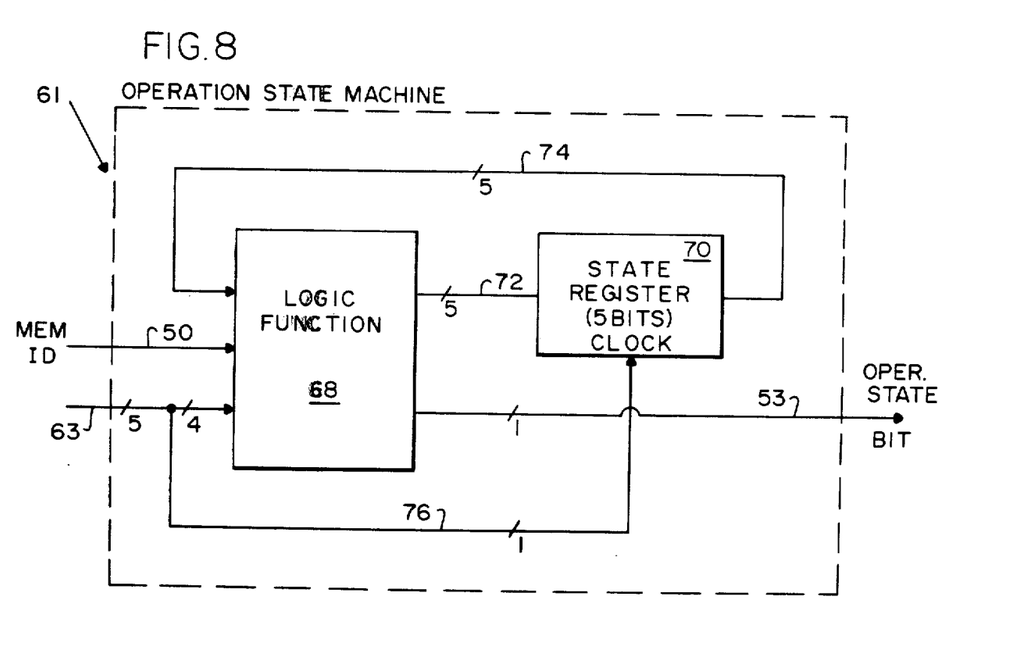
FIG. 8 shows details of the operation state machine 61 of FIG. 2.

Referring to FIGS. 7 and 8, the operation state machines 61 and 67 assure (with a high degree of fault coverage) that all memory modules 21 and the memory control 13, after every cycle of interaction between the memory subsystem and the processor subsystem, are receiving the same commands and are performing the same operations. The logic function 68 in combination with the state register 70 implement the state machine as defined by the state diagrams 4A–4F. The state register 70 comprises five flip-flops commonly known in the prior art.

Referring again to FIGS. 3 and 4A–4F, the state bit on the line 71 and the state bit on the line 52, since they represent in encoded fashion the state of their respective operation state machines, in effect are encoding the sequence of control line states in all previous cycles since the previous reset of the system.

The status of the state machine 67 (see FIG. 3) is produced on the line 71. The status of the state machine 61 (see FIG. 2) is produced on the line 53. The compare logic 69 (see FIG. 3) detects any difference in the state represented on these two lines. This comparison is made only during read cycles. During a read the memory module, selected by the physical address on the bus 33, enables the three-state gate 54 (see FIG. 2); otherwise the gate is disabled, i.e., in a high-impedance state. Thus, an operation state bit is applied to the line 53 by the memory module. If a difference in state is detected by the compare logic 69, the compare logic 69 produces a signal on the operation check error line 41 which is supplied to the memory system error encoder 37 (see FIG. 1), and the memory system error encoder 37, in turn, causes an uncorrectable error signal to be produced on the bus 43. This signal on the bus 43 when received by the CPU 23 then produces a program interrupt for the operating system program. The CPU 23 also reads the syndrome code in the syndrome bus 85. The syndrome code will indicate that the error is not a memory data or address error, thus indicating that the error is an operation check in a particular embodiment of the invention disclosed in this application. This signal (the signal on the operation check error line 41) could also be produced independently. In that event, the error transmitted to the CPU 23 would be classified as an operation check interrupt, rather than a general class of uncorrectable error interrupt as described above.

While we have illustrated and described the preferred embodiments of our invention, it is to be understood that these are capable of variation and modification, and we therefore do not wish to be limited to the precise details set forth, but desire to avail ourselves of such changes and alterations as fall within the purview of the following claims.

We claim:

1. A method of monitoring operation of a memory system that is operable in response to control signals received from a processing unit, the method comprising the steps of:

producing first and second digital state signals, each being respectively associated with the processing unit and the memory system, and each being indicative of the (1) control signals produced by the processing unit and received by the memory system and (2) prior produced digital state signals; and comparing the first and second digital state signals to produce therefrom an error signal indicative of improper operation.

2. In a memory system for storing and retrieving data signals in response to command signals generated by a command means for directing operation of the memory system apparatus for detecting improper memory operation, the apparatus comprising, first state machine means associated with the memory system and coupled to receive the command signals for sequentially assuming a plurality of digital states, second state machine means associated with the command means and coupled to receive the command signals for sequentially assuming a plurality of predetermined digital states, each of the assumed digital states assumed by the first and second state machine means being identical to one another when proper memory system operation occurs, and each of the assumed digital states being determined by the operation dictated by the command signals during an immediately prior assumed digital state and said prior assumed digital state, and circuit means coupled to the first and second state machines means to compare the assumed digital states of each for determining improper memory operation therefrom.

3. In a memory system for storing data in response to command signals issued from a circuit means that controls memory system operation, memory operation error detection apparatus for detecting improper memory operation, the apparatus comprising:

first and second operation state machine means respectively associated with said memory system and said circuit means for sequentially assuming individual ones of a plurality of predetermined digital states in response to the command signals, each assumed digital state being determined, at least in part, by assertion of a command signal during an immediately prior assumed digital state, each of the first and second operation state machine means including means for providing an operation state signal indicative of a current assumed digital state, and comparing means coupled to receive the operation state signals and operable to produce an operation check error signal, indicating improper memory operation.

4. The apparatus of claim 3 wherein,
the command signals correspond to a number of types of memory system operations.

5. The apparatus of claim 3, wherein the first and second state machine means each include logic function means coupled to receive the command signals for producing therefrom the current digital state.

6. The apparatus of claim 5, wherein the first and second state machine means each include state register means for receiving and holding the current digital state produced by the logic function means.

7. The apparatus of claim 6, wherein the logic function means is coupled to the state register means for receiving the prior-assumed digital state to produce, together with the command signals, the current digital state.

8. The apparatus of claim 5, wherein the logic function means includes means for receiving the prior-assumed digital state for providing, together with the received command signals, the current digital state.

* * * * *